United States Patent
Halliyal et al.

(10) Patent No.: US 6,955,997 B1
(45) Date of Patent: Oct. 18, 2005

(54) LASER THERMAL ANNEALING METHOD FOR FORMING SEMICONDUCTOR LOW-K DIELECTRIC LAYER

(75) Inventors: Arvind Halliyal, Cupertino, CA (US); Minh Van Ngo, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/438,860

(22) Filed: May 16, 2003

(51) Int. Cl.[7] .................. H01L 21/469; H01L 21/31
(52) U.S. Cl. ............... 438/778; 438/149; 438/422; 438/239; 438/674; 438/57; 438/305
(58) Field of Search .................. 438/778, 149, 438/422, 239, 674, 57, 305

(56) References Cited

U.S. PATENT DOCUMENTS

| | | | |
|---|---|---|---|
| 4,437,139 A | * 3/1984 | Howard | 361/313 |
| 5,864,172 A | * 1/1999 | Kapoor et al. | 257/634 |
| 6,121,130 A | * 9/2000 | Chua et al. | 438/623 |
| 6,435,943 B1 | * 8/2002 | Chang et al. | 451/28 |
| 6,559,014 B1 | * 5/2003 | Jeon | 438/287 |
| 2002/0168831 A1 | * 11/2002 | Miyasaka | 438/396 |

* cited by examiner

Primary Examiner—Matthew Smith
Assistant Examiner—Igwe U. Ahya

(57) ABSTRACT

A method of manufacturing a semiconductor device, including depositing a first layer of dielectric material onto the device, laser thermal annealing a surface of the first layer, and depositing a second layer of dielectric material over the laser thermal annealed surface of the first layer. The two layers are preferably low dielectric constant ("low-k") material that form an inter-layer dielectric ("ILD") layer of a semiconductor device. According to one aspect of the invention, a third layer of low-k material is deposited over the second layer and a surface of the third layer is also laser thermal annealed.

33 Claims, 3 Drawing Sheets

LASER THERMAL ANNEALING METHOD FOR FORMING SEMICONDUCTOR LOW-K DIELECTRIC LAYER

FIELD OF THE INVENTION

The present invention relates to the manufacturing of semiconductor devices, and more particularly, to a laser thermal annealing method for forming low dielectric constant ("low-k") layers suitable for use in semiconductor devices.

BACKGROUND OF THE INVENTION

The escalating requirements for high density and performance associated with ultra-large scale integration semiconductor devices necessitate design features of 0.10 micron and under, increased transistor and circuit speeds, high reliability, and increased manufacturing throughput. The reduction of design features to 0.10 micron and under challenges the limitations of conventional interconnection technology, including conventional photolithographic, etching, and deposition techniques.

Conventional methodology for forming patterned metal layers comprises a subtractive etching or etch back step as the primary metal forming technique. Such a method involves the formation of a first dielectric layer on a semiconductor substrate, typically monocrystalline silicon (Si), with conductive contacts formed therein for electrical connection with at least one active region formed in or on the substrate, such as a source/drain region of a transistor. A metal layer is deposited on the first dielectric layer and patterned using photolithographic masking and etching techniques to form a desired conductive pattern comprising metal features separated by gaps, such as a plurality of metal lines with interwiring spacings therebetween. A dielectric layer is then applied to the resulting conductive pattern to fill in the gaps and the surface thereof is then planarized by conventional etching or chemical-mechanical polishing (CMP) techniques.

A through-hole is then formed in the dielectric layer to expose a selected portion of an underlying metal feature, the exposed portion of the metal feature at the bottom of the through-hole serving as a contact pad. Upon filling the through-hole with conductive material, such as a metal plug, to form a conductive via, the bottom surface of the conductive via is in electrical contact with the underlying metal feature.

Because many ultra large scale integration (ULSI) devices presently manufactured are very complex and require multiple levels of metallization for interconnections, it has been common to repeat the above-described via formation process multiple times, e.g., to form five levels of metallization interconnected by conductive vias, each level of metallization separated by at least one layer of dielectric material, termed an inter-layer dielectric (ILD).

A problem encountered in highly miniaturized semiconductor devices employing multiple metallization levels and reduced interwiring spacings in both the horizontal and vertical dimensions is related to the resistance-capacitance (RC) time constant of the system. Although semiconductor devices are presently being scaled in the horizontal dimension, they are not generally scaled in the vertical dimension, since scaling in both dimensions would lead to a higher current density that could exceed reliability limits. Horizontal scaling, however, requires conductive lines having a high aspect ratio, i.e., ratios of conductor height to conductor width greater than one, e.g., three or four, along with reduced interwiring spacings. As a consequence, capacitive coupling between conductive lines becomes a significant limitation on circuit speed. If intrametal capacitance is high, electrical inefficiencies and inaccuracies increase. It has been recognized that a reduction in capacitance within multi-level metallization system will reduce the RC time constant between the conductive lines.

The drive towards increased miniaturization and the resultant increase in the RC time constant have served as an impetus for the development of newer, low dielectric constant ("low-k") materials as substitutes for conventional higher dielectric constant silicon oxide-based ILD materials. However, such dielectric materials must be able to serve a number of different purposes requiring diverse characteristics and attributes. For example, the ILD material must: prevent unwanted shorting of neighboring conductors or conducting levels by acting as a rigid, insulating spacer; prevent corrosion and/or oxidation of metal conductors, by acting as a barrier to moisture and mobile ions; fill deep, narrow gaps between closely spaced conductors; and undergo planarization of uneven surface topography so that a relatively flat level of conductors can be reliably deposited thereon. In addition, ILD films or layers must be formed at relatively low temperatures in order to avoid damage to or destruction of underlying conductors. Another, and important consideration in regard to RC time constant effects, is that such dielectric films used as ILD materials must have a low dielectric constant, as compared to the value of 3.9 of silicon dioxide ($SiO_2$), in order to reduce the RC time constant, lower power consumption, reduce cross-talk, and reduce signal delay in closely spaced conductors. In addition, such ILD materials are preferably free from hazardous outgassing, have excellent adhesive quality and mechanical strength; and can be formed through common processes such as spin coating and chemical vapor deposition.

For example, Benzocyclobutene (BCB), a class of organic materials and derivatives thereof, manufactured by Dow Chemical Co., Midland, Mich., is a relatively newer low-k material that offers many advantages for use in multilevel interconnect technology. BCB materials are resistant to diffusion by metals, such as copper (Cu) and gold (Au), and can therefore serve as a barrier to diffusion of contact metals. In addition, BCB materials exhibit very low values of dielectric constant (k), i.e., about 2.4 to 2.7, as compared to 3.9 to 4.1 of $SiO_2$. Moreover, BCB materials can be applied by conventional spin-coating processing, resulting in good gap-filling and well planarized ILD layers.

Another approach to obtaining an interlayer dielectric having A dielectric constant of less than 2.2 is to take in and confine air, whose dielectric constant is as low as 1.0. Thus, many material makers are working for the development of porous films for use in the interlayer dielectric.

In any event, what are still desired are improved ILD layers and methods of forming such layers. The improved ILD layers will preferably exhibit very low values of dielectric constant (k) as compared to $SiO_2$. In addition, the method of forming such improved low-k ILD layers will preferably preserve the low-k qualities of the layer, promote adhesion and mechanical strength of the layers, reduce or eliminate outgassing from the layer, and improve reliability of the layer. Also, the method of forming such improved low-k ILD layers will preferably be able to be incorporated with common layer forming processes such as spin coating and chemical vapor deposition. For example, the method can preferably be performed in a high-throughput, automated, track-type semiconductor device manufacturing apparatus, particularly as employed in the manufacture of ultra large scale integration semiconductor devices having multiple metallization levels.

SUMMARY OF THE INVENTION

This and other needs are met by embodiments of the present invention which provide an improved method of manufacturing a semiconductor device. The method includes depositing low dielectric constant ("low-k") material in multiple layers to form an inter-layer dielectric ("ILD"), wherein surfaces of at least some of the multiple layers are conditioned with laser thermal annealing.

The method of the present invention produces a semiconductor device having a low-k ILD that exhibits very low values of dielectric constant (e.g., as compared to $SiO_2$), good adhesion and mechanical strength, reduced or eliminated outgassing, and improved reliability. In addition, the method of the present invention can be incorporated with common layer forming processes such as spin coating and chemical vapor deposition.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DETAILED DESCRIPTION OF THE INVENTION

The present invention addresses and solves problems related to forming very low dielectric constant ("low-k") interlayer dielectrics ("ILD") in semiconductor devices. The problems are solved, in part, by embodiments of the present invention which provide for an improved method of processing a semiconductor device including depositing an ILD in multiple layers, wherein at least some of the ILD layers are conditioned with laser thermal annealing. The method of the present invention produces a semiconductor device having a low-k ILD that exhibits very low values of dielectric constant (e.g., as compared to $SiO_2$), good adhesion and mechanical strength, reduced or eliminated outgassing, and improved reliability. In addition, the method of the present invention can be incorporated with common layer forming processes such as spin coating and chemical vapor deposition.

FIGS. 1–6 illustrate an exemplary embodiment of the method of the present invention as applied to a semiconductor comprising a metal-oxide-semiconductor (MOS) device 10. However, it should be understood that the method of the present invention can be applied to other types of semiconductor devices.

Figure 1:
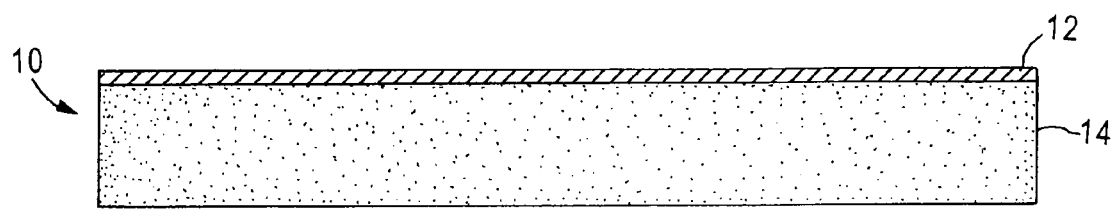
FIGS. 1–6 schematically illustrate sequential phases of a semiconductor fabrication method for depositing and conditioning a low dielectric constant ("low-k") inter-layer dielectric ("ILD") layer including laser thermal annealing processes according to an embodiment of the present invention.

In FIG. 1 a conductive layer 12 is provided for example on a substrate 14 and can be formed from any conductive material suitable for integrated circuit manufacturing, such as aluminum or copper. The present invention is not limited to any particular form of conductive layer 12. For example, the conductive layer 12 may comprise a metal interconnect, a contact or via, a gate, or a retrograde well of a substrate, or other conductive components of a MOS device. For purposes of illustration, a single conductive layer having a uniform thickness is shown.

The substrate 14 can be formed from any material suitable for integrated circuit manufacture, and the present invention is not limited to any particular type of semiconductor substrate. Separate MOS devices are separated on the silicon substrate 14 using isolation structures, such as a field oxide or a shallow isolation trench (not shown).

Figure 2:
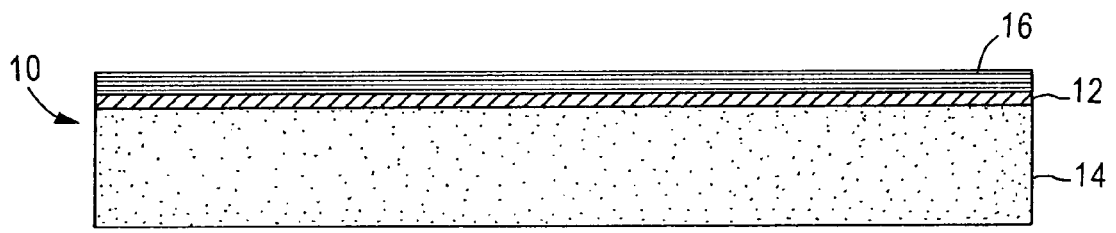

FIG. 2 shows a first layer 16 of an ILD constructed in accordance with the present invention deposited on the conductive layer 12 using a conventional method such as a deposition process including, but not limited to: chemical vapor deposition (CVD), plasma-assisted CVD, atomic layer CVD, sputtering and other like deposition processes. The first layer 16 of the ILD can also be applied by spin-coating, depending upon the material used.

The first layer 16 is preferably comprised of a low-k material. Low-k dielectric materials can be categorized, for example, as doped oxide, organic, highly fluorinated, and porous materials. The porous class of materials introduces microporosity into the base materials to reduce the net capacitance. For example, commonly used silicon dioxide ($SiO_2$) has dielectric constant of 4.2, while air, which is considered the perfect insulator, has a dielectric constant of 1.0. Porous materials, including a combination of mostly base materials and some air, can achieve therefore lower dielectric constants than the base materials alone. These porous materials are developed for sub 0.10 $\mu$m design rules, since dielectric constants between 2 and 3 can be obtained. Oxides, doped oxides, organics, or even highly fluorinated materials are used as the base materials with air applied in appropriate pore morphologies. As mentioned, low-k materials can be deposited either by spin-on or CVD methods. Porous materials are typically spun on, with controlled evaporation of solvent providing the desired pore structure.

Table 1 provides examples of low-k materials for use as layers of an exemplary embodiment of the ILD of the present invention.

TABLE 1

| Examples of Low-K Materials | | |
|---|---|---|
| Material | K | Application Method |
| Low-K | | |
| Polyimides | 3.0–3.6 | Spin-on |
| Spin-on glasses | 2.7–3.1 | Spin-on |
| Fluorinated polyimides | 2.6–2.9 | Spin-on |
| DLC (diamond-like carbon) | 2.8–3.0 | CVD |
| Poly(arylene ethers) | 2.6–2.9 | Spin-on |
| Poly(arylenes) | 2.6–2.8 | Spin-on |
| Cyclotenes | 2.6–2.8 | Spin-on |
| Parylene N | 2.6–2.8 | CVD |

TABLE 1-continued

Examples of Low-K Materials

| Material | K | Application Method |
| --- | --- | --- |
| Poly(norbornenes) | 2.5–2.7 | Spin-on |
| Polyimide-SSQ hybrids | 2.7–3.0 | Spin-on |
| Alkyl-silanes/$N_2O$ | 2.4–2.7 | CVD |
| Ultra Low-k | | |
| Teflon-AF | 1.9–2.1 | Spin-on |
| Teflon microemulsion | 1.9–2.1 | Spin-on |
| Porous dielectrics | | |
| Polyimide nanofoams | 2.2 | Spin-on |
| Silica aerogels | 1.1–2.2 | Spin-on |
| Silica xerogels | 1.5–2.2 | Spin-on |
| Mesoporous silica | 1.9–2.2 | Spin-on |

Figure 3:
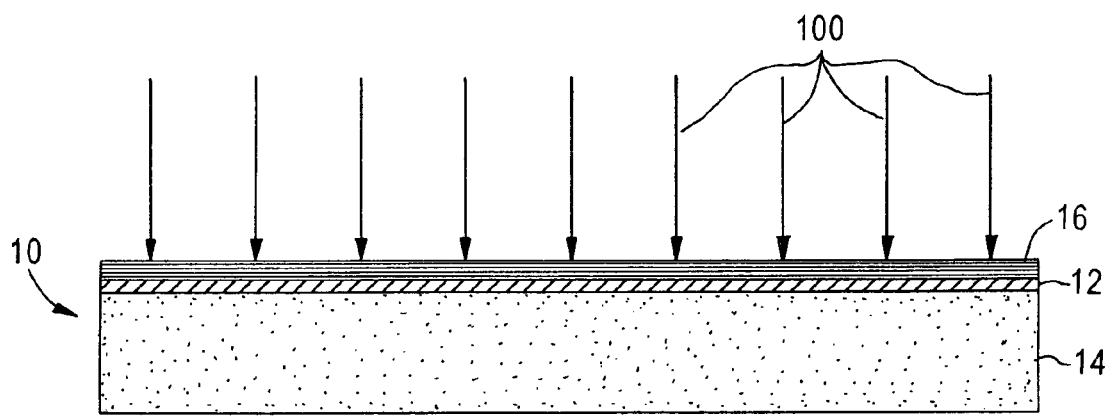

Referring to Table 1, the first layer 16 of the ILD is preferably made of a material(s) having a dielectric constant of between about 1.8 and 3.5. Referring also to FIG. 3, the method of the present invention further includes using a laser thermal annealing process upon a surface of the first layer 16 of the ILD. The laser energy, represented by arrows 100 in FIG. 3, is applied to the surface of the first layer 16 of the ILD. An example of a laser capable of providing this energy is a spatially homogenized 308 nm XeCl pulsed laser, although the invention is not limited in this manner, and the energy and power of the laser can vary in accordance with different applications.

The energy 100 from the laser is applied to the surface of the first layer 16 such that the surface is melted to a predetermined depth. If the layer is provided with a thickness of about 100 angstroms, for example, the surface can be melted to a depth of between about 10 and 60 angstroms, for example.

The melted surface of the first layer 16 is allowed to rapidly cool, within about one microsecond, and reform epitaxially. In so doing, defects in the surface of the first layer 16 are substantially removed or reduced. In addition, the laser thermal annealing removes excess organics and carbon from the surface, and reduces stresses in the layer.

The energy fluence of the laser at the surface of the layer 16 determines the melt duration that occurs at the surface, and melt duration is related to maximum melt depth. The relationship between melt duration and maximum melt depth depends on the temporal profile of the laser beam. Precise control of melt depth is possible due to the capability of measuring the full width height maximum (FWHM) of the laser and the surface melt duration during the process. Relatively large changes in the energy fluence are required to create small changes in the maximum melt depth. The total melt time can be varied by varying the number and/or energy of the laser pulses.

The fluence range for laser irradiation can extend from about 50 mJ/$cm^2$ to about 1.3 J/$cm^2$. However, the fluence of the laser can be advantageously controlled to melt only to a depth that the layer 16 has been amorphitized because amorphous portions of the layer absorbs energy at a higher rate than crystalline portions of the layers. For example, a fluence of about 400 mJ/$cm^2$ can be used to melt amorphous portions and not melt crystalline portions, if any.

By melting and rapidly cooling the surface of the first layer 16 using laser thermal annealing the crystallinity and microstructure of the surface can be controlled, such that the surface, to a predetermined depth, has grains with uniformly small grain sizes. The laser thermal annealing can be carried out in multiple steps, such as melting the surface at low power and then nucleating and growing the grains of the surfaces such that the grains have uniformly small grain sizes.

Annealing by laser is a well-understood process that correlates strongly to conventional oven annealing. However, lasers offer certain advantages over conventional heating sources. For example, the induction or flow of heat energy into the desired substrate is more rapid. Turning off the laser instantly turns off the heating source. Lasers allow much more efficient control of the size of the area to be heated, whether large or localized. The variety of lasers available (in terms of wavelength, power, and pulse width) allows flexibility in dealing with diverse substrates and materials. Laser heating can also produce temperature ramping where desired. All of these processes can easily be controlled by computer for purposes of automation and precise control of heating rates.

Figure 4:
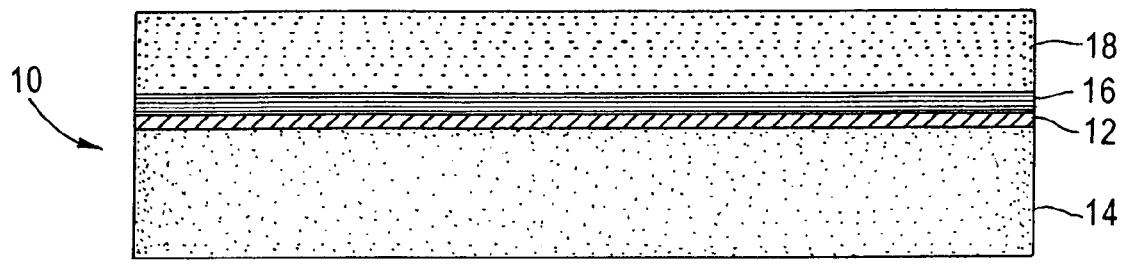

Referring now to FIG. 4, the method of the present invention further includes depositing a second layer 18 of the ILD over the surface of the first layer 16. The second layer 18 is deposited using a conventional method such as a deposition or spin-coating process, depending upon the material used. As illustrated, the second layer 18 is preferably provided with a greater thickness than a thickness of the first layer 16. The second layer 18 can be provided with a thickness of between about 10 and about 500 angstroms, for example. Referring to Table 1, the second layer 18 of the ILD is preferably made of a material(s) having a dielectric constant of between about 1.8 and 3.0. In an exemplary embodiment, the second layer 18 of the ILD comprises a porous dielectric.

Figure 5:
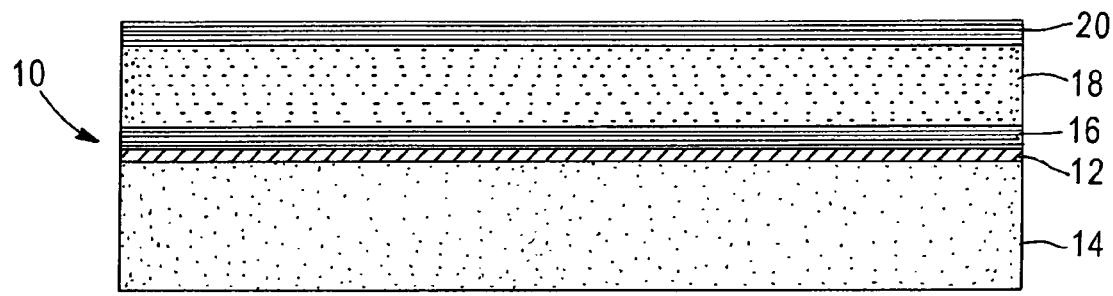

As shown in FIG. 5, the method of the present invention additionally includes depositing a third layer 20 of the ILD over the second layer 18. As illustrated, the third layer 20 is preferably provided with a thickness about equal to the thickness of the first layer 16. In addition, the third layer 20 is preferably made of the same material(s) as the first layer 16. The third layer 20 is deposited using a conventional method such as a deposition or spin-coating process. An ILD constructed in accordance with the present invention, however, can also include embodiments wherein all layers have the same thickness, all layers have different thicknesses, and an embodiment wherein the second layer is thicker than the first and the third layers.

Figure 6:
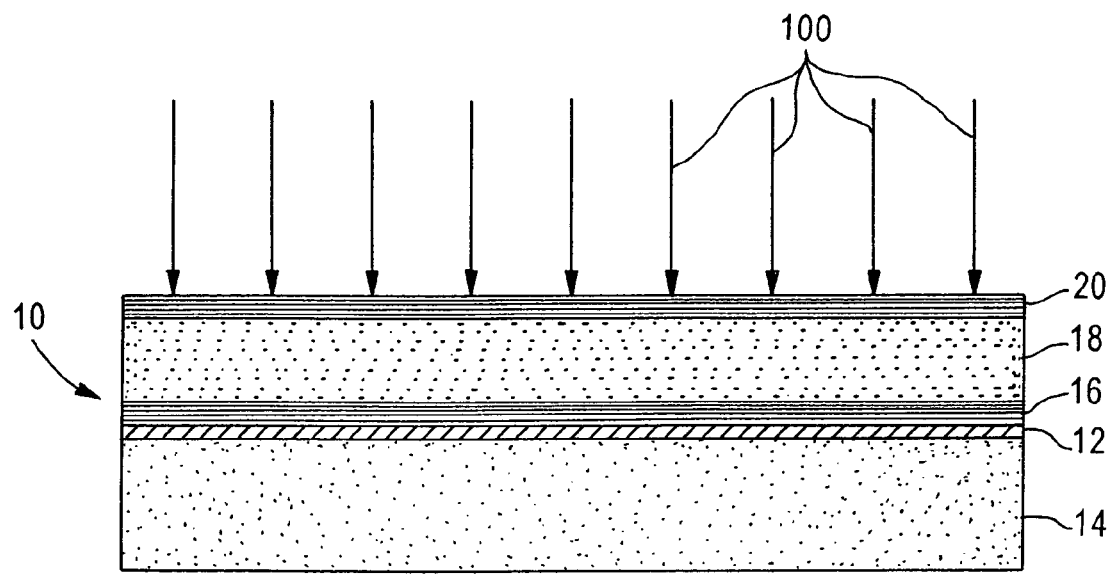

As shown in FIG. 6, the method of the present invention includes laser annealing a surface of the third layer 20, similar to the first layer 16 of the ILD as describe above. It should be noted, that each layer 16, 18, 20 of the ILD can also be baked, cured and cooled (before laser annealing) if desired. In laser annealing the surface of the third layer 20, defects in the surface are substantially removed or reduced. In addition, the laser thermal annealing removes excess organics and carbon from the surface, and reduces stresses in the layer 20. Further layers of material, whether conductive or non-conductive, that are deposited over the surface of the third layer 20 bond more strongly to the third layer due to the laser annealing.

Figure 7:
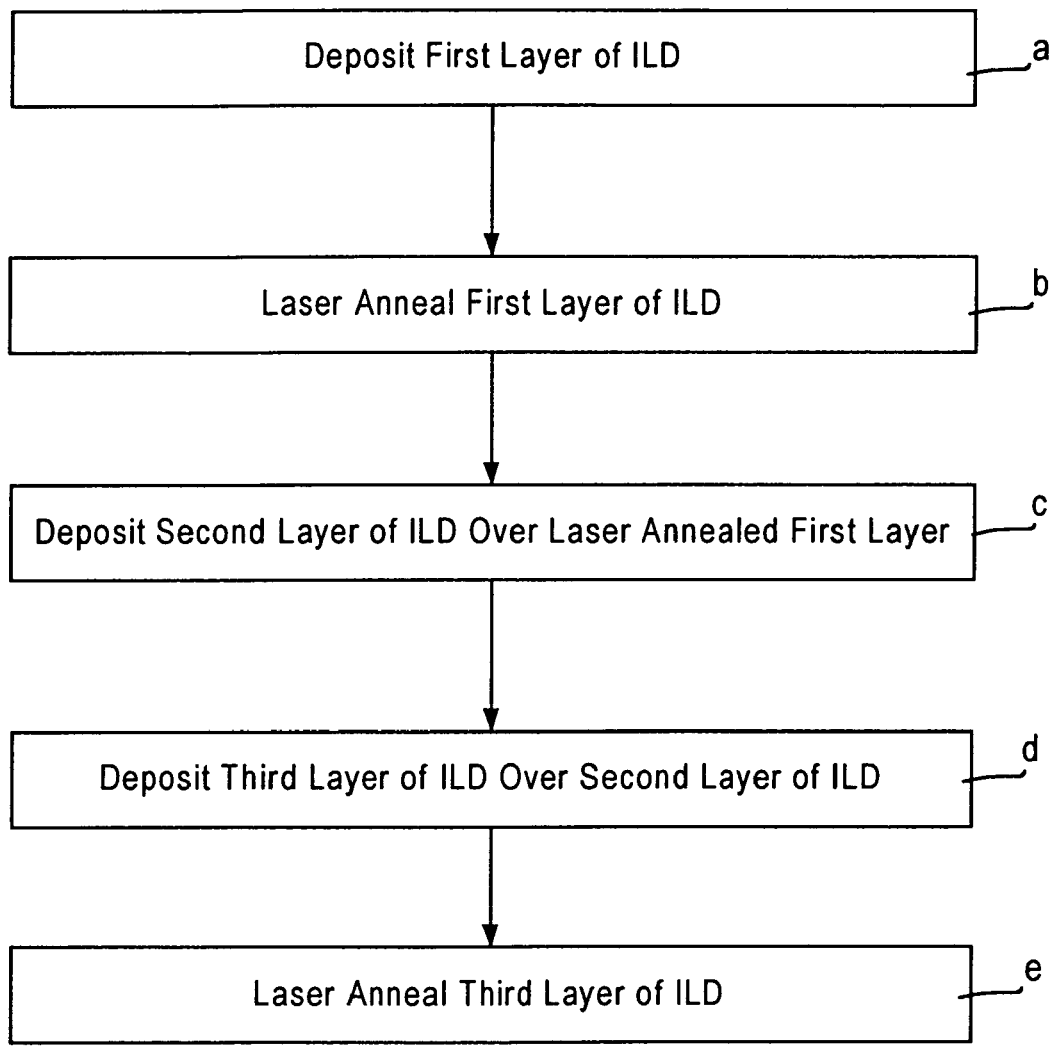
FIG. 7 is a flow chart also illustrating the semiconductor fabrication method of FIGS. 1–6.

FIG. 7 is a flow chart illustrating a simplified embodiment of the method of forming the ILD as shown in FIGS. 1-6. As shown at "a" of FIG. 7, the first layer 16 of low-k material is deposited on the semiconductor device 10, e.g., over the conductive layer 12, and is then laser annealed in accordance with the present invention as shown at "b" of FIG. 7 and as discussed above. The second layer 18 of the ILD is then deposited over the laser annealed first layer 16, as shown at "c". As shown at "d" of FIG. 7, the third layer 20 of low-k material is deposited on the second layer 18, and is then laser annealed in accordance with the present invention as shown at "e".

The exemplary embodiment of the ILD constructed in accordance with the present invention, therefore, includes three layers 16, 18, 20. In at least one exemplary embodiment, the first and the third layers 16, 20 comprise non-porous dielectrics, while the second layer 18 comprises a porous dielectric. In this manner, newer, more exotic ultra low-k dielectric materials can be used in the second layer 18, while more traditional and stronger low-k materials can be used in the first and the third layers 16, 20. An ILD constructed in accordance with the present invention, therefore, provides an ultra low dielectric constant, while continuing to be strong, reliable and bond well with adjacent layers of the semiconductor device.

The second layer 18 of the ILD may also be laser thermal annealed, similar to the first and the third layers 16, 20 of the ILD as describe above. However, since the second layer 18 is made from more exotic ultra low-k dielectric materials, laser thermal annealing the second layer 18 may not be desirable. In the exemplary embodiment of the ILD constructed in accordance with the present invention, and described above, the second layer 18 is not laser thermal annealed. Instead, the second layer 18 is sandwiched between the more traditional and stronger low-k materials of the first and the third layers 16, 20, and the first and the third layers 16, 20 are laser thermal annealed but the second layer 18 is not laser thermal annealed. It should be understood, however, that the present invention also contemplates an ILD wherein the sandwiched ultra low-k dielectric layer, e.g., the second layer 18, is also laser thermal annealed.

A particular process flow has been described with a particular embodiment. It should be apparent that the present invention is applicable in general to layers of interlayer dielectrics employed over, under or in between metalization layers, conductive layers, etc. The application of laser thermal annealing to an ILD in accordance with the invention provides an ILD that exhibits very low values of dielectric constant, good adhesion and mechanical strength, reduced or eliminated outgassing, and improved reliability. In addition, the method of the present invention can be incorporated with common layer forming processes such as spin coating and chemical vapor deposition.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well-known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concepts as expressed herein.

What is claimed is:

1. A method of manufacturing a semiconductor device, comprising:
    depositing a first layer of low-k dielectric material onto the device;
    laser thermal annealing a surface of the first layer; and
    depositing a second layer of dielectric material over the laser thermal annealed surface of the first layer;
    wherein the surface of the first layer is laser thermal annealed such that the surface has a substantially uniform grain size.

2. The method of manufacturing a semiconductor device according to claim 1, wherein the laser thermal annealing includes melting the surface of the first layer at a relatively low power and allowing the melted surface to cool relatively rapidly.

3. The method of manufacturing a semiconductor device according to claim 1, wherein the surface of the first layer is melted to a depth of between about 10 and 100 angstroms.

4. The method of manufacturing a semiconductor device according to claim 1, wherein the first layer is non-porous.

5. The method of manufacturing a semiconductor device according to claim 1, wherein the first layer is made of material having a dielectric constant of between about 1.8 and 3.5.

6. The method of manufacturing a semiconductor device according to claim 1, wherein the first layer is provided with a thickness less than a thickness of the second layer.

7. The method of manufacturing a semiconductor device according to claim 1, wherein the second layer is porous.

8. The method of manufacturing a semiconductor device according to claim 1, wherein the second layer is made of material having a dielectric constant of between about 1.8 and 3.5.

9. The method of manufacturing a semiconductor device according to claim 1, further comprising depositing a third layer of dielectric material over the second layer of dielectric material.

10. The method of manufacturing a semiconductor device according to claim 9, further comprising laser thermal annealing a surface of the third layer.

11. The method of manufacturing a semiconductor device according to claim 9, wherein the third layer is non-porous.

12. The method of manufacturing a semiconductor device according to claim 9, wherein the third layer is made of material having a dielectric constant of between about 1.8 and 3.5.

13. The method of manufacturing a semiconductor device according to claim 9, wherein the third layer is provided with a thickness less than a thickness of the second layer.

14. The method of manufacturing a semiconductor device according to claim 9, wherein the third layer is provided with a thickness substantially equal to a thickness of the first layer.

15. The method of manufacturing a semiconductor device according to claim 1, wherein the laser thermal annealing is conducted at a fluence range from about 50 mJ/cm$^2$ to about 1.3 J/cm$^2$.

16. A method of manufacturing a semiconductor device, comprising:
    depositing a first layer of low-k dielectric material onto the device;
    depositing a second layer of dielectric material over the first layer, wherein the second layer comprises at least one of ultra low-k dielectric material and porous dielectric material;

depositing a third layer of low-k dielectric material over the second layer; and laser thermal annealing a surface of at least one of the first layer and the second layer.

17. The method of manufacturing a semiconductor device according to claim 16, wherein the laser thermal annealing includes melting the surface of the layer at a relatively low power and allowing the melted surface to cool relatively rapidly.

18. The method of manufacturing a semiconductor device according to claim 16, wherein the surface is laser thermal annealed such that the surface has a substantially uniform grain size.

19. The method of manufacturing a semiconductor device according to claim 16, wherein the surface is melted to a depth of between about 10 and 100 angstroms.

20. The method of manufacturing a semiconductor device according to claim 16, wherein the first and the third layers are non-porous.

21. The method of manufacturing a semiconductor device according to claim 16, wherein the first and the third layers are each provided with a thickness less than a thickness of the second layer.

22. The method of manufacturing a semiconductor device according to claim 16, wherein the second layer is porous.

23. The method of manufacturing a semiconductor device according to claim 16, wherein the second layer is made of ultra-low dielectric material having a dielectric constant of between about 1.1 and about 2.2.

24. The method of manufacturing a semiconductor device according to claim 16, wherein surfaces of both the first and the third layers are laser thermal annealed.

25. The method of manufacturing a semiconductor device according to claim 16, wherein the first and the third layers are made of material having a dielectric constant of between about 2.4 and about 3.6.

26. The method of manufacturing a semiconductor device according to claim 16, wherein the third layer is provided with a thickness substantially equal to a thickness of the first layer.

27. The method of manufacturing a semiconductor device according to claim 16, wherein the laser thermal annealing is conducted at a fluence range from about 50 mJ/cm$^2$ to about 1.3 J/cm$^2$.

28. The method of manufacturing a semiconductor device according to claim 16, wherein a surface of the second layer is laser thermal annealed.

29. A method of manufacturing a semiconductor device, comprising sandwiching a layer of ultra-low dielectric constant material between layers of low dielectric constant material to form an interlayer dielectric layer, wherein a surface of at least one of the layers of low dielectric constant material is conditioned with laser thermal annealing.

30. The method of manufacturing a semiconductor device according to claim 29, wherein the layers of low dielectric constant material are non-porous.

31. The method of manufacturing a semiconductor device according to claim 29, wherein the layer of ultra-low dielectric constant material is porous.

32. The method of manufacturing a semiconductor device according to claim 29, wherein a surface of the layer of ultra-low dielectric constant material is conditioned with laser thermal annealing.

33. The method of manufacturing a semiconductor device according to claim 29, wherein the layer of ultra-low dielectric constant material is provided with a thickness greater than a thickness of either of the layers of low dielectric constant material.

* * * * *